United States Patent [19]

Mizuishi et al.

[11] Patent Number: 5,106,593

[45] Date of Patent: Apr. 21, 1992

[54] APPARATUS FOR PRODUCING CZOCHRALSKI-GROWN SINGLE CRYSTALS

[75] Inventors: Koji Mizuishi; Michiaki Oda, both of Annaka; Yasushi Nakamura; Seiichiro Ohtsuka, both of Tomioka; Atsushi Shiozawa, Fukushima; Fumio Yamada, Gunma; Masahiro Mashimo; Tooru Ohara, both of Annaka; Eizi Namiki, Tomioka, all of Japan

[73] Assignee: Shin-Etsu Handotai Co., Ltd., Tokyo, Japan

[21] Appl. No.: 631,850

[22] Filed: Dec. 21, 1990

[30] Foreign Application Priority Data

Dec. 22, 1989 [JP] Japan .................................. 1-333277
Jul. 31, 1990 [JP] Japan .................................. 2-202873

[51] Int. Cl.⁵ .......................................... C30B 15/20
[52] U.S. Cl. .................................... 422/249; 254/264; 254/268; 254/276; 422/245
[58] Field of Search ................... 254/264, 268, 276; 422/245, 249; D56/DIG. 93

[56] References Cited

U.S. PATENT DOCUMENTS

| 3,607,112 | 9/1971 | Mermelstein | 422/249 |
| 4,118,197 | 10/1978 | Mackintosh et al. | 422/249 |
| 4,352,785 | 10/1982 | Schellin | 422/249 |
| 4,367,199 | 1/1983 | Jericho | 422/249 |
| 4,371,502 | 1/1983 | Sibley et al. | 422/249 |
| 4,916,955 | 4/1990 | Katsuoka et al. | 422/249 |

FOREIGN PATENT DOCUMENTS

| 2096389 | 5/1987 | Japan | 422/249 |
| 2078188A | 1/1982 | United Kingdom | 422/249 |

Primary Examiner—Robert Kunemund
Assistant Examiner—Felisa Garrett
Attorney, Agent, or Firm—Armstrong, Nikaido, Marmelstein, Kubovcik & Murray

[57] ABSTRACT

An apparatus for producing a single crystal grown by Czochralski method includes a winding drum disposed in a case for winding up and down a flexible pull wire, a power transmission mechanism for driving the winding drum, and a bearing unit for rotatably supporting the winding drum. The power transmission mechanism and the bearing unit are disposed outside the case and isolated from the furnace atmosphere surrounding the winding drum and the pull wire in the case. With this construction, metallic dust produced by abrasion from the power transmission mechanism and the bearing unit has no influence on the condition of the furnace atmosphere and hence the quality of a single crystal being pulled upwardly by the pull wire.

15 Claims, 8 Drawing Sheets

FIG. 8

APPARATUS FOR PRODUCING CZOCHRALSKI-GROWN SINGLE CRYSTALS

BACKGROUND OF THE INVENTION

1. Field of the Invention

The present invention relates to an apparatus for producing single crystals grown by the Czochralski (CZ) method also known as the pulling method. More particularly, it relates to such an apparatus which is capable of protecting a Czochralski-grown single crystal from contamination with metal while the single crystal is pulled by a flexible pulling means such as a pull wire.

2. Description of the Prior Art

In apparatus for producing Czochralski-grown single crystals and single crystal silicons, in particular, a pulling mechanism generally comprises of a winding mechanism including a flexible pulling means such as a pull wire. Regarding the winding mechanism, various attempts have been proposed, as disclosed in Japanese Patent Laid-open Publication Nos. 57-27997, 57-118088 and 62-65994.

All such known winding mechanisms include a power transmission mechanism, composed of a gear mechanism or a pulley mechanism, and a bearing mechanism that are disposed in a winding portion or unit which is kept under the same condition as the furnace atmosphere. These mechanisms necessarily constitute a dust-generating source which will contaminate a Czochralski-grown single crystal with metal.

SUMMARY OF THE INVENTION

With the foregoing difficulties of the prior art in view, it is an object of the present invention to provide an apparatus for producing a Czochralski-grown single crystal which protects the single crystal from contamination with metal, thereby improving crystallographic quality of the single crystal and lowering the process-induced defects such as OSF (oxidation induced stacking fault) thereof.

In brief, an apparatus of this invention includes a winding drum disposed in a case for winding up and down a flexible pulling means such as a pull wire, a power transmission mechanism for driving the winding drum, and a bearing unit for rotatably supporting the winding drum. The power transmission mechanism and the bearing unit are disposed outside the case and isolated from the furnace atmosphere surrounding the winding drum and the flexible pulling means disposed in the case. With this construction, metallic dust produced by inter-abrasion amid the power transmission mechanism and the bearing unit is no longer possible to enter the furnace atmosphere. Thus, a single crystal being pulled by the flexible pulling means is protected from contamination with metal.

More specifically, according to the present invention, there is provided an apparatus for producing a single crystal grown by Czochralski method, which comprises: a main chamber having a quartz crucible disposed therein; a winding unit disposed above the main chamber, a gate valve unit, a pull chamber and a bearing unit disposed to support the winding unit spaced above the gate valve, the winding unit including a winding drum for winding and unwinding a flexible pulling means to pull a single crystal up from a melt of similar material retained in the quartz crucible while rotating the single crystal; a horizontal turn plate rotatably disposed on the bearing unit; a case disposed on the turn plate and receiving therein the winding drum, the case having a pair of diametrically opposite first and second projected openings; a spline shaft rotatably disposed in the case and extending perpendicular to an axis of rotation of the turn plate, the spline shaft having one end projecting outwardly from the first projected opening and connected in driven relation to a rotational power transmission mechanism disposed on the turn plate, the opposite end of the spline shaft projecting outwardly from the second projected opening and rotatably supported by a bearing plate upstanding from the turn plate; a spline nut movably mounted on the spline shaft and carrying thereon the winding drum; a first hollow shaft loosely receiving therein a portion of the spline shaft and connected at its one end to one end of the winding drum; a second hollow shaft loosely receiving therein a portion of the spline shaft and connected at its one end to the opposite end of the winding drum, the second hollow shaft having an externally threaded portion on its outer peripheral surface; and a shaft guide plate connected to the second projected opening to substantially close the same and having an internally threaded hole meshed with the externally threaded portion of the second hollow shaft. With this construction, the spline shaft driven by the rotational power transmission mechanism in forward and backward directions causes the winding drum to move in both directions along a longitudinal axis of the spline shaft while rotating about its own axis clockwise and counterclockwise, thereby winding and unwinding the flexible pulling means. The power transmission mechanism and the bearing plate which constitute a dust generating source are disposed outside the case and hence they no longer contaminate the winding drum and the flexible pulling means disposed in the case. With the flexible pulling means thus isolated from the dust generating source, the single crystal being grown is free from contamination with metal.

Preferably, the apparatus further includes means for completely sealing the furnace atmosphere surrounding the winding drum and the flexible pulling means wound thereon from the environmental atmosphere. The sealing means comprises first and second magnetic seal devices each including a hollow inner shaft fixedly mounted on an outer peripheral surface of one of the first and second hollow shafts and a tubular housing rotatably mounted on the inner shaft with a magnetic fluid sealingly retained therebetween, first bellows means having an end connected to the housing of the first magnetic seal device and an opposite end connected to a peripheral edge of the first projected opening, second bellows means having an end connected to the housing of the second magnetic seal device and an opposite end connected to a peripheral edge of the second projected opening. With this sealing means, metallic dust generated from the power transmission mechanism, the spline shaft and nut and the bearing plate due, for example, to abrasion have no adverse influence on the condition of the furnace atmosphere and hence the quality of the single crystal being produced. The bellows means preferably comprises welded bellows. Each of the first and second magnetic seal devices further includes an annular permanent magnet disposed centrally between the housing and the inner shaft, and a pair of annular pole pieces located on opposite sides of the permanent magnet, the inner shaft having a pair of groups of parallel spaced peripheral grooves formed in its outer peripheral surface at portions corresponding in position to the position of the respective pole pieces, the magnetic fluid being sealingly received in said peripheral grooves.

The apparatus may include a guide pulley disposed above the winding drum for guiding the flexible pulling means as the latter is winding on and unwinding from the winding drum. With this guide pulley thus provided, the winding and unwinding operation of the winding drum can be achieved accurately.

Preferably, a pulley cover is disposed adjacent to the guide pulley for covering a peripheral surface of an upper portion of the guide pulley so as to prevent the flexible pulling means from getting off the guide pulley. The pulley cover has an arcuate inside surface complementary in contour to the shape of the peripheral surface of the guide pulley. The pulley cover may be of an integral structure or composed of a plurality of cover pieces hinged together. The pulley cover preferably is formed of a rigid abrasion resistive plastic.

At least one retainer pin may be disposed close to the periphery of the guide pulley so as to extend over and across a peripheral guide groove in the guide pulley for holding the flexible pulling means in the guide groove against displacement. As an alternative, it is possible to provide a spring-biased guide roller urged against the peripheral surface of the guide pulley.

According to a preferred embodiment, a travel sensor is associated with a portion of the rotational power transmission mechanism for detecting a distance of movement of the winding drum in a direction parallel to the longitudinal axis of the spline shaft. With this travel sensor thus provided, the winding operation of the winding drum can be performed efficiently and accurately. The travel sensor may be of any sort of known sensors however the combination of a slit disc and a photocoupler is preferable.

Many other advantages and features of the present invention will become manifest to those versed in the art upon making reference to the detailed description and the accompanying sheets of drawings in which preferred structural embodiments incorporating the principles of the present invention are shown by way of illustrative example.

DETAILED DESCRIPTION OF THE INVENTION

Figure 1:
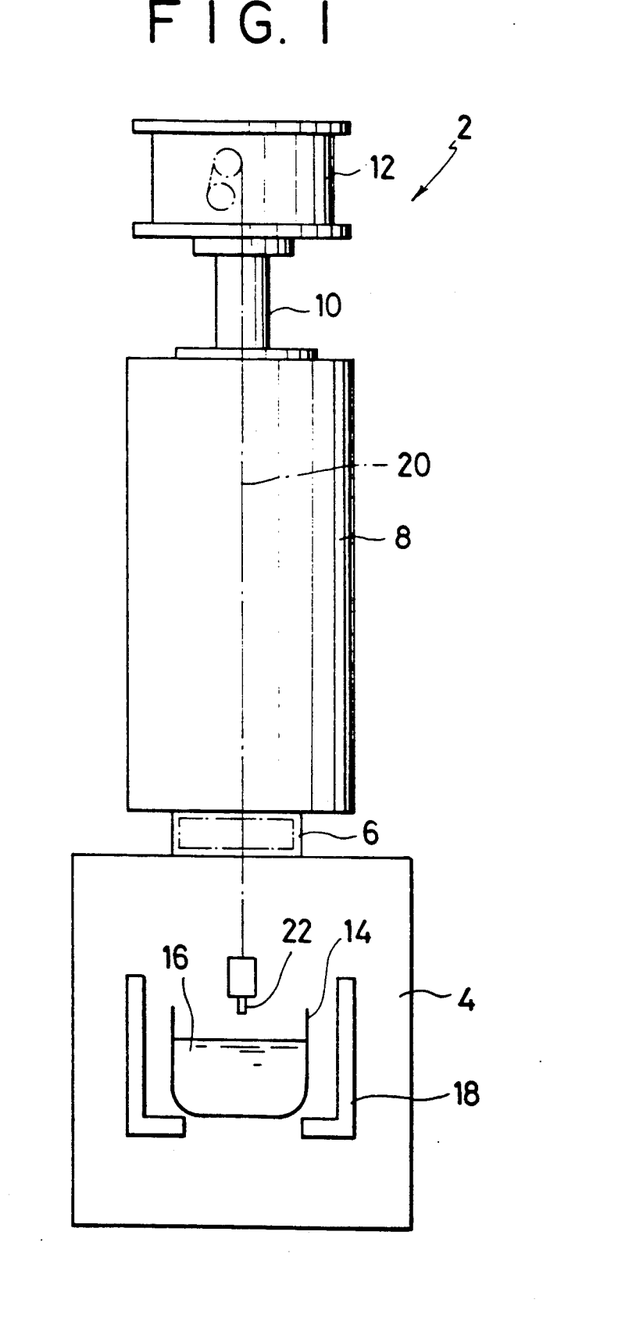
FIG. 1 is a diagrammatic front elevational view showing the general construction of an apparatus for producing a Czochralski-grown single crystal according to the present invention.

Referring to the drawings, wherein like reference characters designate like or corresponding parts throughout the several views, FIG. 1 diagrammatically shows an apparatus 2 of this invention for producing a single crystal grown by the Czochralski (CZ) method also known as the pulling method.

The apparatus 2 includes a main chamber 4 and a pull chamber 8 disposed above the main chamber 4 with a gate valve unit 6 disposed therebetween. Disposed above the pull chamber 8 is a winding unit 12 supported by a bearing unit 10. The main chamber 4, the gate valve unit 6 and the pull chamber 8 are well known and hence a description is no longer needed.

The main chamber 4 receives therein a quartz crucible 14 in which a melt 16 of polycrystalline silicon is retained. The quartz crucible 14 is heated by a heater 18 disposed around the quartz crucible 14. A flexible pulling means 20 which is composed of a pull wire in the illustrated embodiment, extends vertically from the winding unit 12 though the pull chamber 8 into the main chamber 4. The pull wire carries on its distal end a seed crystal 22 and is vertically movable to dip the seed crystal 22 into the quartz crucible 14 filled with the silicon melt 16, then slowly pull the seed crystal 22 up from the silicon melt 16 while rotating it, thereby producing a large single crystal silicon grown by the CZ method. The pull wire 20 may be replaced with another flexible winding means 20 such as a ball chain.

Figure 2:
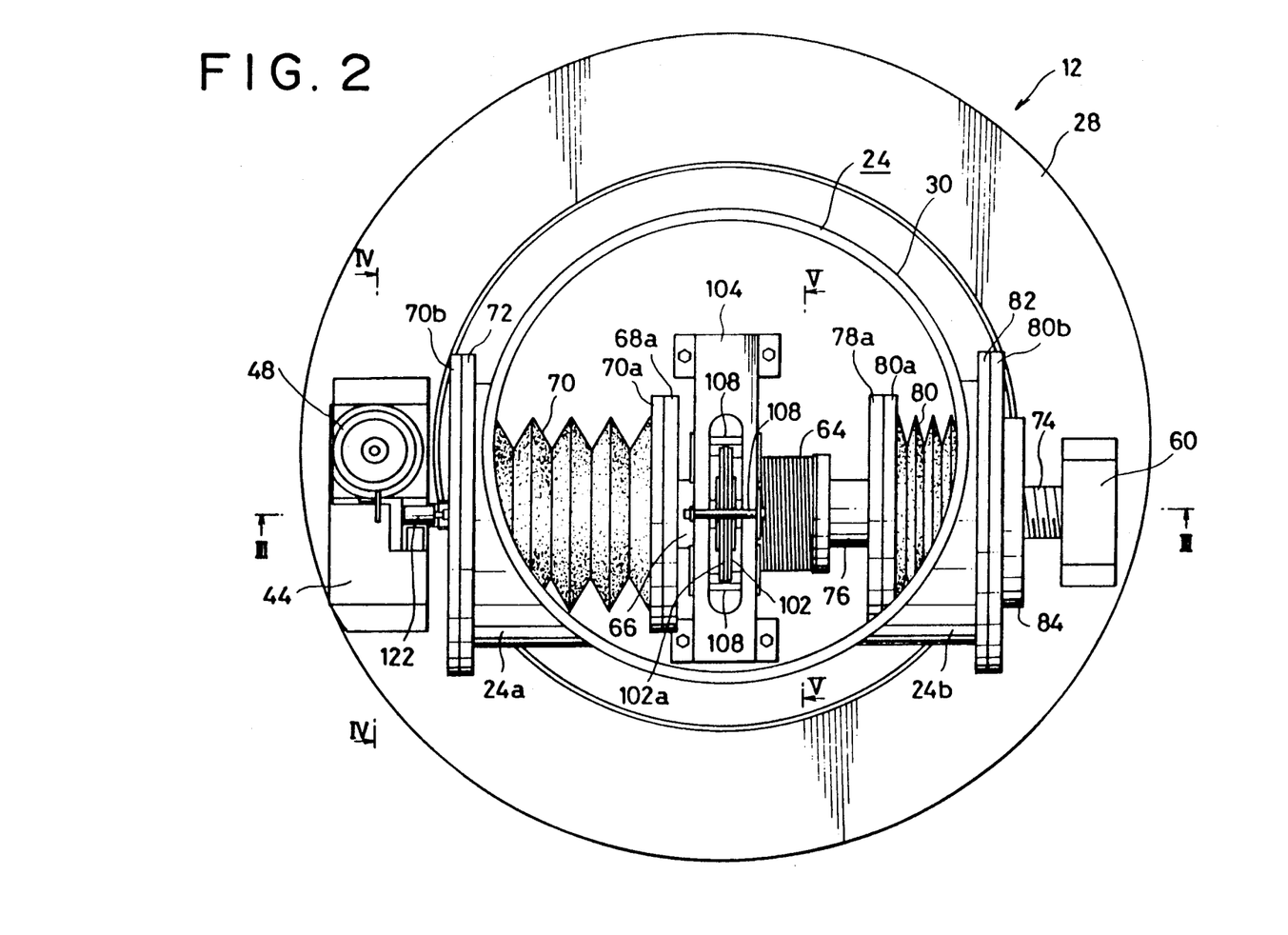
FIG. 2 is a top plan view of a winding unit of the apparatus, with a top cover and a drive motor omitted for clarity.

The winding unit 12 includes, as shown in FIG. 2, a case 24 for receiving therein a main portion of the winding unit 12. The case 24 is composed of a horizontal circular turn plate 28 rotatably mounted on an upper end of the bearing unit 10 via a bearing 26 (FIG. 3), a tubular side wall 30 disposed on an upper surface of the turn plate 28, and a cover 32 attached to an upper end of the side wall 30. The case 24 further has a pair of first and second projected openings or sleeves 24a, 24b projecting radially outwardly from diametrically opposite portions of the tubular side wall 30.

Figure 3:
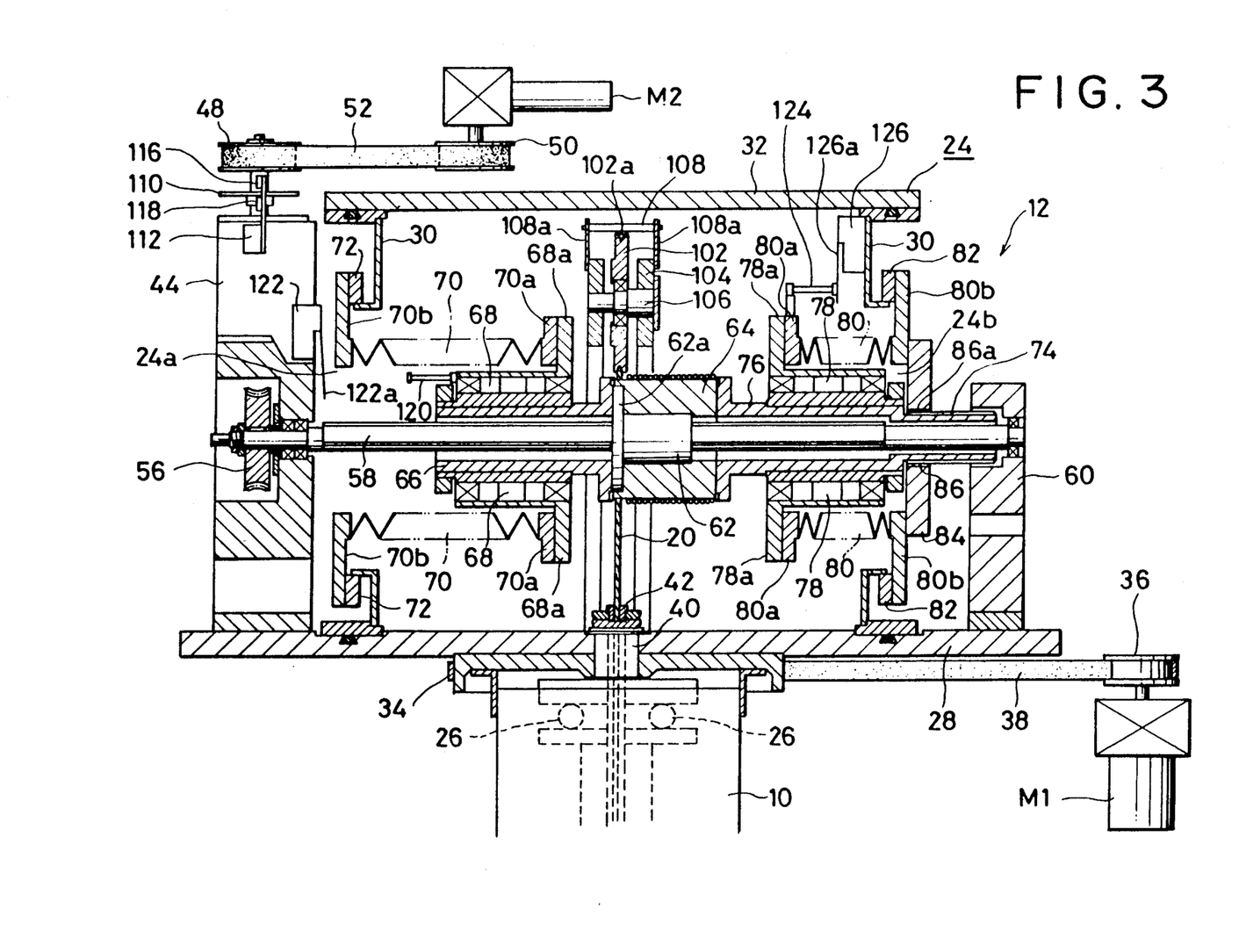
FIG. 3 is a cross-sectional view taken along line III—III of FIG. 2.

As shown in FIG. 3, a pulley member 34 is concentrically mounted on the under surface of the turn plate 28 and is connected in driven relation to a first drive pulley 36 via a first endless belt 38. The drive pulley 36 is directly driven by a geared motor MI. When the motor MI is energized, the pulleys 36, 34 are driven to rotate the turn plate 28 and, therefore, the winding unit 12 mounted on the turn plate 28. A vertical hollow shaft 40 is integral with and extends through the center of the turn plate 28 and the pulley member 34 for the passage therethrough of the pull wire 20. A wire guide bushing 42 is attached to an upper end of the hollow shaft 40. The bushing 42 has an opening of a small diameter for guiding the pull wire 20.

Figure 4:
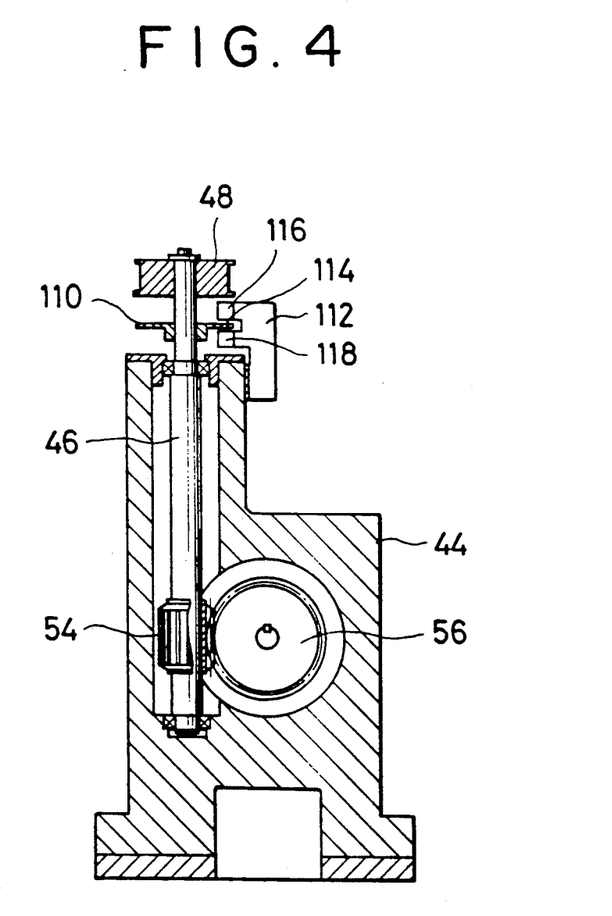
FIG. 4 is a cross-sectional view taken along line IV—IV of FIG. 2.

A gear box 44 is disposed on the turn plate 28 adjacent to the first projected opening 24a of the case 24. The gear box 44 houses therein a vertical worm shaft 46, with an upper end portion of the worm shaft 46 projecting outwardly from the gear box 44, as shown in FIG. 4. A pulley 48 is attached to the upper end of the worm shaft 46 and is connected in driven relation to a second drive pulley 50 via a second endless belt 52 (FIG. 3). The drive pulley 50 is directly driven by a geared reversible motor M2. A worm 54 is provided on a lower portion of the worm shaft 46 and meshes with a worm wheel 56. When the motor M2 is energized, the pulleys 50, 48 are driven to rotate the worm shaft 46, the worm 54 and the worm wheel 56. The gear mechanism received in the bear box 44 constitutes a rotational power transmission mechanism for transmitting a rotational power or driving force from the motor M2 to a spline shaft described later. Needless to say, the power transmission mechanism may comprise any other known mechanism such as a pulley-and-belt assembly, for example.

The spline shaft designated by 58 is shown in FIG. 3. The spline shaft 58 preferably comprises a ball spline shaft and, therefore, in the illustrated embodiment a description will be given to such ball spline shaft. The ball spline shaft 58 is disposed horizontally in the case 24 and has one end or a proximal end projecting outwardly from the first projected opening 24a and secured to the worm wheel 56. The opposite end or the distal end of the ball spline shaft 58 projects outwardly from the second projected opening 24b and is rotatably supported by a bearing plate 60 upstanding from the turn plate 28 near the second projected opening 24b.

A ball spline nut 62 fitted over the ball spline shaft 58 is rotatable in response to the rotation of the ball spline shaft 58 and is slidably movable longitudinally along the ball spline shaft 58. The ball spline nut 62 has at its one end a circular flange 62a. A winding drum 64 is fixedly mounted on an outer periphery of the ball spline nut 62 for winding the pull wire 20.

The flange 62a of the ball spline nut 62 has an end face extending flush with an end face of the winding drum 64 and secured to one end or a proximal end of a horizontal hollow shaft 66 in which a part of the ball spline shaft 58 is loosely received. A tubular first magnetic seal device 68 is mounted on an outer peripheral surface of the hollow shaft 66 and has at its one end or a proximal end a flange 68a. A first welded bellows 70 extends loosely over the first magnetic seal device 68 and has at its opposite ends first and second annular flanges 70a, 70b. The first annular flange 70a which is disposed on the proximal end side of the first magnetic seal device 68 is secured to the flange 68a of the first magnetic seal device 68, while the second annular flange 70b is secured to a flange 72 of the first projected opening 24a of the case 24.

The opposite end face of the winding drum 64 is secured to one end or a proximal end of a externally threaded horizontal hollow shaft 76 in which a part of the ball spline shaft 58 is loosely received. The hollow shaft 76 has an externally threaded portion 74 extending from the distal end (right end in FIG. 3) toward the proximal end (left end in FIG. 3) of the hollow shaft 74. A tubular second magnetic seal device 78 is mounted on an outer peripheral surface of the externally threaded hollow shaft 76 and has at its one end or a proximal end a flange 78a. A second welded bellows 80 extends loosely over the second magnetic seal device 78 and has at its opposite ends first and second annular flanges 80a, 80b. The first annular flange 80a which is disposed on the proximal end side of the second magnetic seal device 78 is secured to the flange 78a of the second magnetic seal device 78, while the second annular flange 80b is secured to a flange 82 of the second projected opening 24b of the case 24.

A shaft guide plate 84 is secured to the second annular flange 80b of the second welded bellows 80 so as to substantially close an opening of the second annular flange 80b. The shaft guide plate 84 has a central guide hole 86 having an internal thread 86a which is meshed with the externally threaded portion 74 of the hollow shaft 76. The externally threaded portion 74 of the hollow shaft 76 has a screw pitch which is equal to the winding pitch of the winding drum 64 on which the pull wire 20 is wound. The larger the screw pitch, the greater the winding pitch. In other words, the winding pitch varies with the screw pitch. Consequently, the screw pitch of the externally threaded portion 74 is so set as to provide an optimum winding pitch of the winding drum 64.

Figure 6:
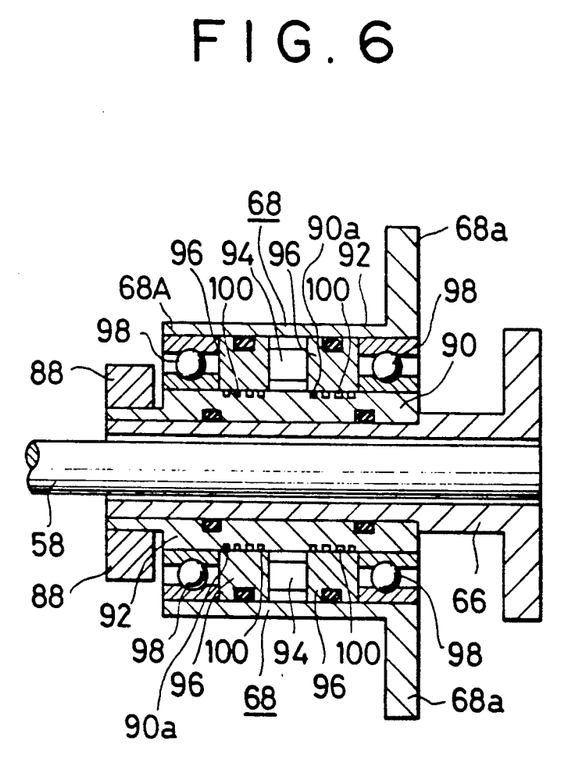
FIG. 6 is a cross-sectional view of a first magnetic seal device incorporated in the winding unit shown in FIG. 2.

The first and second magnetic seal devices 68, 78 are disposed in mirror-image relation to one another with about the winding drum 64 and have a same construction. Due to this identical construction, only one magnetic seal device 68 will be described in greater detail with reference to FIG. 6. A circular clamp disc 88 serves to fasten a body 68A of the magnetic seal device 68 to an outer peripheral surface of the hollow shaft 66. The magnetic seal device 68 includes a tubular inner shaft 90 firmly fitted over the outer peripheral surface of the hollow shaft 66, and a tubular housing 92 extending around the inner shaft 90 and formed integrally with the flange 68a. An annular permanent magnet 94 is disposed centrally between the housing 92 and the inner shaft 90 with a pair of annular pole pieces 96, 96 located on opposite sides of the permanent magnet 94. A pair of ball bearings 98, 98 are disposed between the housing 92 and the inner shaft 90 and located on opposite ends of the housing 92. A magnetic fluid 100 is sealingly received in a plurality of parallel spaced peripheral grooves 90a extending circumferentially in the outer peripheral surface of the inner shaft 90 at a portion corresponding in position to the position of each pole piece 96. As described above with reference to FIG. 3, the flange 68a of the magnetic seal device 68 is secured to the first flange 70a of the first welded bellows 70, so that the housing 92 of the magnetic seal device 86 is not rotatable. On the other hand, the inner shaft 90 of the magnetic seal 68 is fixedly connected to the hollow shaft 66 and hence is rotatable together with the hollow shaft 66. The outer peripheral surface of the inner shaft 90 and the inner peripheral surface of the housing 92 are completely sealed or isolated from one another by the magnetic fluid 100 sealingly received in the peripheral grooves 90a.

Figure 5:
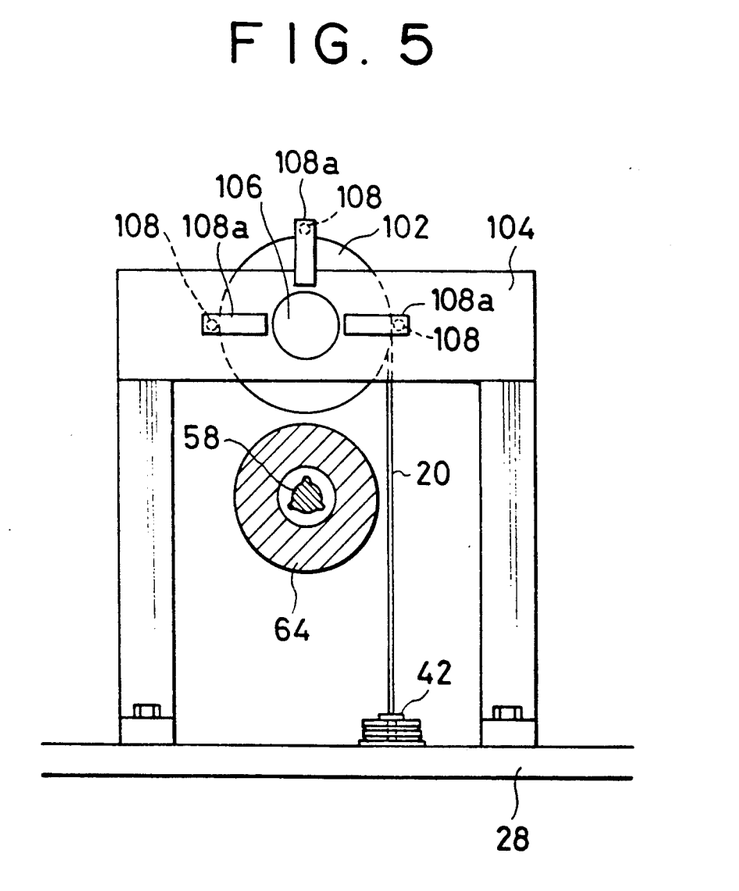
FIG. 5 is a cross-sectional view taken along line V—V V of FIG. 2.

As shown in FIG. 5, a guide pulley 102 for guiding therearound the pull wire 20 is disposed above the winding drum 64 and rotatably mounted on a horizontal shaft 106 supported by an upstanding pulley support 104. The pulley support 104 is secured at its lower end to the turn plate 28. The guide pulley 102 is provided with means for holding the pull wire 20 on the guide pulley 102 against displacement. The holding means comprises a plurality (three in the illustrated embodiment) of retainer pins 108 disposed close to an outer peripheral surface of the guide pulley 102 and extending over and across a guide groove 102a extending circumferentially in the periphery of the guide pulley 102, and a plurality of pairs of confronting support members 108a, 108a attached to opposite end faces of the guide pulley 102 for supporting the respective retainer pins 108. The pairs of support members 108a are circumferentially spaced at proper intervals. The retainer pins 108 thus provided serves to hold the pull wire 20 in the guide groove 102a of the guide pulley 102 against displacement.

As shown in FIG. 4, a circular slit disc 110 having a number of slits circumferentially spaced at equal intervals is attached to the upper end portion of the worm shaft 46 and hence is rotatable in unison with the worm shaft 46. A photocoupler 112 associated with the slit disc 110 is composed of a light emitting member or device 116 such as a light emitting diode (LED) and a light sensitive member or device 118 such as a phototransistor that are disposed in confrontation to one another with a space 114 therebetween. The photocoupler 112 is disposed on an upper end of the gear box 44 in such a manner that the slit peripheral edge portion of the slit disc 110 moves in the space 114 across a light beam emitted form the light emitting device 116 toward the light sensitive device 118 when the slit disc 110 is rotated by the worm shaft 46. The slit disc 110 and the photocoupler 112 jointly constitute a travel sensor for detecting a distance of angular movement of the winding drum 64 to thereby measuring a lift travel of the pull wire 20. Any other suitable known means or device may be used as the travel sensor.

Referring back to FIG. 3, reference character 120 designates a first pusher rod projecting horizontally from an upper portion of the first magnetic seal device 68 toward the gear box 44. When the first magnetic seal device 68 moves toward the gear box 44, the first pusher rod 120 engages an actuator 122a of a first limit switch 122 to activate the limit switch 122. A second pusher rod 124 is connected to an upper portion of the second flange 80b of the second welded bellows 80. When the second magnetic seal device 78 moves toward the shaft guide plate 84, the second pusher rod 124 engages an actuator 126a of a second limit switch 126 to activate the limit switch 126 which is mounted on a portion of the side wall 30 located adjacent to the second flange 80b connected to the shaft guide plate 84. The first and second limit switches 122, 126 thus provided define two opposite extremities of the axial movement or travel of the winding drum 64. It is obvious that these limit switches 122, 126 may be substituted by any other know sensor means or device.

The apparatus of the foregoing construction will operate as follows.

For producing a single crystal silicon rod grown by the CZ method or pulling method, the quartz crucible 14 is charged with polycrystalline silicon. After the main chamber 4 is evacuated with vacuum, an inert gas such as argon is introduced into the main chamber 4 until the main chamber 4 is set at a predetermined pressure level. Then, the heater 18 is energized to heat the quartz crucible 14 to melt down the polycrystalline silicon received therein. After the seed crystal 22 is attached to the leading end of the pull wire 20, the pull wire 20 is lowered to dip the seed crystal 22 into the silicon melt 16 retained in the quartz crucible 14, and then slowly lifted to pull the seed crystal 22 up from the silicon melt 16 while rotating it, thereby producing a single crystal silicon rod of a desired diameter grown in the CZ method. The single crystal silicon rod thus pulled is subsequently removed from the pull chamber 8.

The winding and unwinding operation of the pull wire 20 will be described below in greater detail because it constitutes a feature of this invention. The single crystal silicon rod being pulled is rotated, so that the winding unit 12 and, therefore, the pull wire 20 must be rotated while it is pulled. To this end, the motor M1 is driven to rotate the pulley 36 and the pulley member 34 which in turn causes simultaneous rotation of the turn plate 28 and the winding unit 12 including the pull wire 20. At the same time, the motor M2 is drive to rotate in a forward direction whereby the pulleys 50, 48 are driven to rotate the worm shaft 46, the worm 54 and the worm wheel 56. Rotation of the worm wheel 56 causes the ball spline shaft 58 to turn in the forward direction to rotate the winding drum 64 in the same direction whereby the pull wire 20 is wound on the winding drum 64. Simultaneously therewith, the hollow shaft 66, 76, the inner shaft 90 and the clamp discs 88 of the respective magnetic seal devices 68, 78 are rotated. In this instance, because the externally meshed portion 74 of the hollow shaft 76 is meshed with the internally threaded portion 86a of the guide hole 86 in the shaft guide plate 84, the hollow shaft 76 while rotating in the forward direction moves rightward in FIG. 3 toward the bearing plate 60. The second magnetic seal device 78, the winding drum 64, the ball spline nut 62, the hollow shaft 66 and the first magnetic seal device 68 are structurally united with the hollow shaft 76 and hence they moves rightward toward the bearing plate 60 in unison with the hollow shaft 76 while rotating about a longitudinal axis of the ball spline shaft 58. Since the screw pitch of the externally threaded portion 74 of the hollow shaft 76 is set to provide an optimum winding pitch of the winding drum 64, the pull wire 20 is wound on the winding drum 64 accurately at the optimum winding pitch. As the winding drum 64 moves rightward in FIG. 3, the pull wire 20 being wound moves progressively from the distal end (right end in FIG. 3) toward the proximal end (left end in FIG. 3) of the winding drum 64.

The operation of the motor M2 is properly controlled to wind up the pull wire 20 for pulling the single crystal silicon rod up form the silicon melt 16 and subsequently removing the single crystal silicon rod from the pull chamber 8. When the single crystal silicon rod is pulled to an uppermost position, this means that a further winding up of the pull wire 20 is no longer needed. In this instance, the second pusher rod 124 engages the actuator 126a of the second limit switch 126 to stop or terminate operation of the motor M2. Thus, the rotation of the ball spline shaft 58 is stopped and hence the rotational and axial movement of the winding drum 64 is terminated.

The distance of angular movement of the winding drum 64 in the forward direction, i.e. the lift travel of the pull wire 20 is detected by the travel sensor in which the photocoupler 112 counts the number of slits in the slit disc 110 which have passed across the path of light beam defined in the photocoupler 112. With this detection of the lift travel, the winding condition of the pull wire 20 can be controlled with accuracy.

When the predetermined length of the pull wire 20 is wound up, the single crystal silicon rod thus pulled is removed. Thereafter, a next cycle of the pulling operation is started. In this instance, the pull wire 20 must be unwound. To this end, the motor M2 is driven to rotate in the reverse direction, thereby removing the direction of rotation of the ball spline shaft 58 and the winding drum 64. This reversal of the rotational direction causes the hollow shaft 76 to rotate in the reverse direction. Owing to the interaction between the externally threaded portion 74 of the hollow shaft 76 and the internally threaded guide hole 86 in the shaft guide plate 84, the winding drum 64, the hollow shafts 66, 76 and the first and second magnetic seal devices 68, 78 are displaced leftward in FIG. 3 toward the gear box 44 while rotating in the reverse direction about the longitudinal axis of the ball spline shaft 58. A continuous unwinding or releasing of the pull wire 20 causes the seed crystal 2 to dip into the silicon melt 16. This means that a further unwinding of the pulley wire 20 is no longer needed. In this instance, the first pusher rod 120 engages the actuator 122a of the first limit switch 122 to stop operation of the motor M2. Thus, the rotation of the ball spline shaft 68 is stopped and hence the rotational and axial movement of the winding drum 4 is terminated. The distance of angular movement of the winding drum 64 in the reverse direction, i.e. the rewind travel of the pull wire 20 is detected by the travel sensor in the same manner as done with the detection of the lift travel of the pull wire 20. More specifically, the photocoupler 112 counts the number of slits in the slit disc 110 which have passed across the path of light beam defined in the photocoupler 112. With this detection of the lift travel, the unwinding condition of the pull wire 20 can e accurately controlled. Subsequently, a next cycle of the winding operation is started and the pull wire 20 is pulled upward.

In the illustrated embodiment, the winding operation of the pull wire 20 is performed by displacing the winding drum 64 rightward in FIG. 3 toward the bearing plate 60 while rotating it in one direction for winding the pull wire 20 in such a manner that the pull wire 20 being wound on the winding drum 64 progressively moves in a direction from the distal end (right end in FIG. 3) toward the proixmal end (left end in FIG. 3) of the winding drum 64. Conversely, the unwinding operation of the pull wire 20 is performed by displacing the winding drum 64 leftward in FIG. 3 toward the gear box 44 while rotating it in the opposite direction for unwinding the pull wire 20 in such manner that the pull wire 20 being unwound from the winding drum 74 progressively moves in a direction from the proximal end (left end in FIG. 3) toward the distal end (right end in FIG. 3) of the winding drum 64. Obviously, it is possible according to the invention to wind the pull wire 20 by displacing the winding drum 64 leftward in FIG. 3 toward the bear box 44 while rotating it in one direction for winding the pull wire 20 in such a manner that the pull wire 20 being wound on the winding drum 64 progressively moves in a direction from the proximal end (left end in FIG. 3) toward the distal end (right end in FIG. 3) of the winding drum 64, the unwinding operation being achieved by displacing the winding drum 64 rightward in FIG. 3 toward the bearing plate 56 while rotating it in the opposite direction so that the pull wire 20 being unwound from the winding drum 64 progressively moves in a direction from the distal end (right end in FIG. 3) toward the proximal end (left end in FIG. 3) of the winding drum 64.

According to one feature of this invention, the gear mechanism 54, 56 and the ball spline shaft 58 are isolated form the furnace atmosphere to protect the single crystal rod against contamination with metal. To this end, the first and second magnetic seal devices 68, 78 and the first and second welded bellows 70, 80 are provided. The distal end portion of the hollow shaft 66, the distal end portion of the externally threaded hollow shaft 76, the gear box 44 and the bearing plate 60 are disposed on the atmospheric side and hence exposed to the atmosphere. These components are sealed from the furnace atmosphere by the first and second magnetic seal devices 68, 78. Furthermore, partly because the first welded bellows 70 sealingly interconnects the flange 68a of the first magnetic seal device 68 and the flange 72 of the first projected opening 24a, and partly because the second welded bellows 80 sealingly interconnects the flange 78a of the second magnetic seal device 78 and the flange 82 of the second projected opening 24b, the furnace atmosphere is completely isolated from the atmospheric side. Consequently, even if metallic contaminants are produced on the atmospheric side due, for example, to abrasion of the moving parts, they have no effect on the condition of the furnace atmosphere.

In the preferred embodiment described above, the welded bellows 70, 80 are used. These welded bellows 70, 80 may be replaced by other bellows means so long as the same function can be attained. It may be considered that the bellows can be substituted by O-rings, oil seals as they provide a hermetic seal while allowing movement of a shaft to which they are attached. These seal members are brought into frictional engagement with the shaft and hence necessarily constitute a dust generating source and, therefore, they are not suitable for use in this invention. Known bellows means include a formed or integral type and a welded type. The welded bellows used in this invention are preferable because they can be expanded and contracted by a small force.

As described above, the dust generating source is substantially eliminated by the apparatus of this invention. As a result, the single crystal grown by the CZ method is stable in quality and can be produced at a higher production rate and yield. Since metal particles produced by abrasion are prevented from falling into the furnace atmosphere, the Czochralski-grown single crystal is protected from contamination with metal. Consequently, crystal defects such as OSF are reduced and the efficiency of the CZ process is increased.

Figure 7:
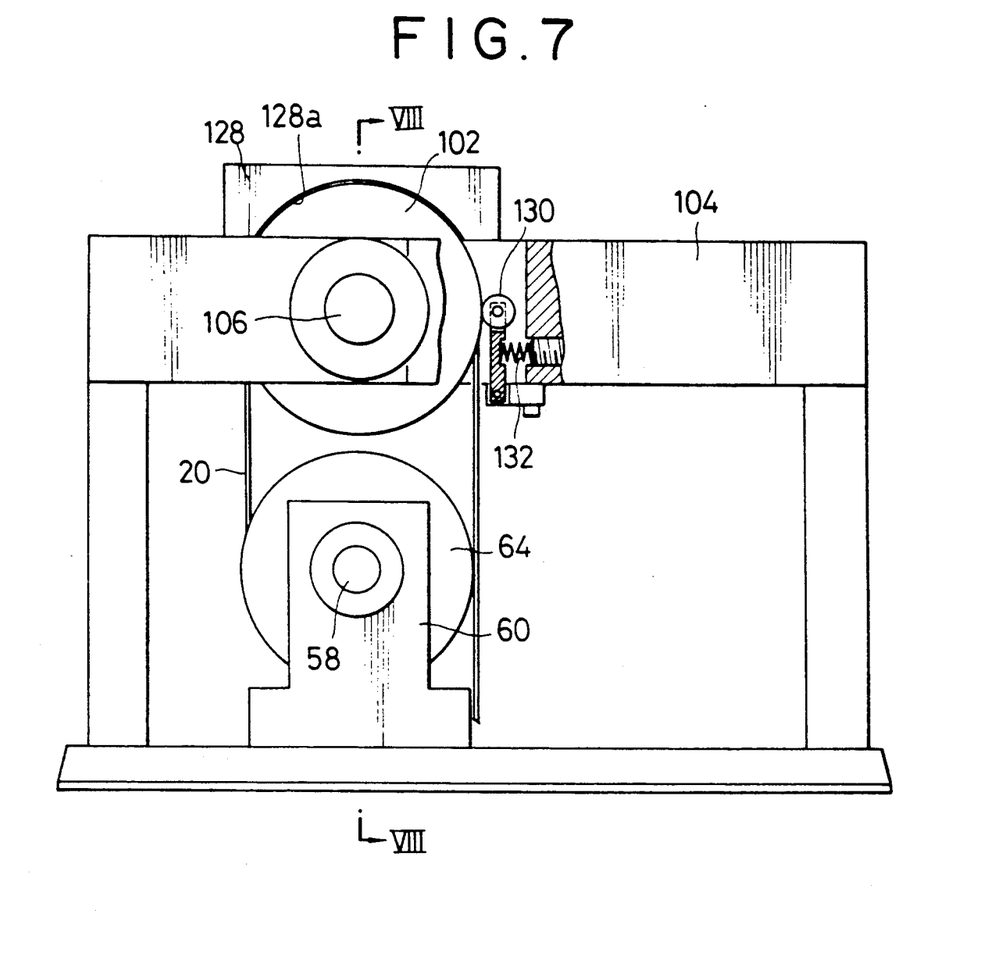
FIG. 7 is a front elevational view, with parts broken away and in section, of a modified winding unit.
Figure 8:
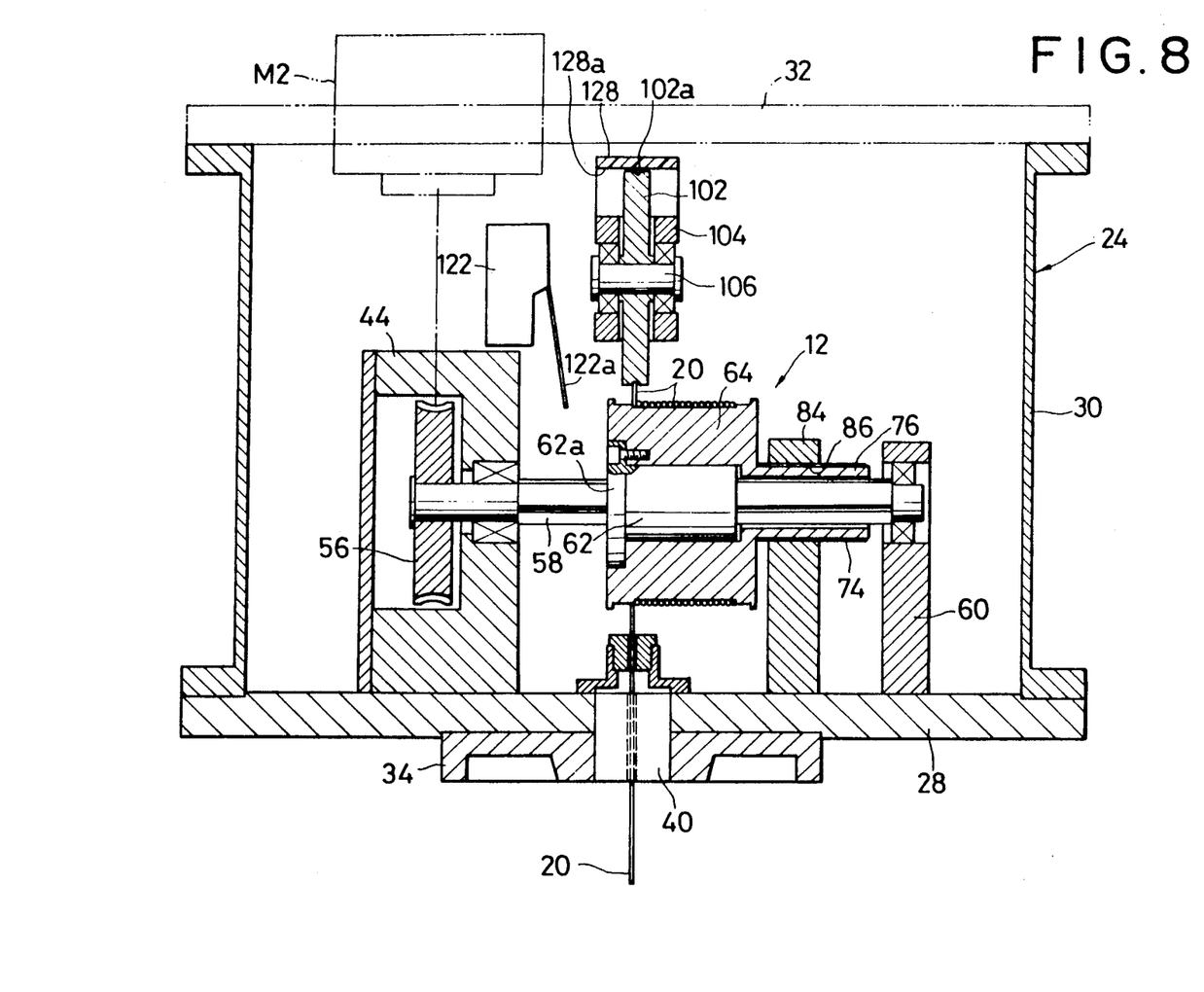
FIG. 8 is a cross-sectional view taken along line VII—VII of FIG. 7.
Figure 9:
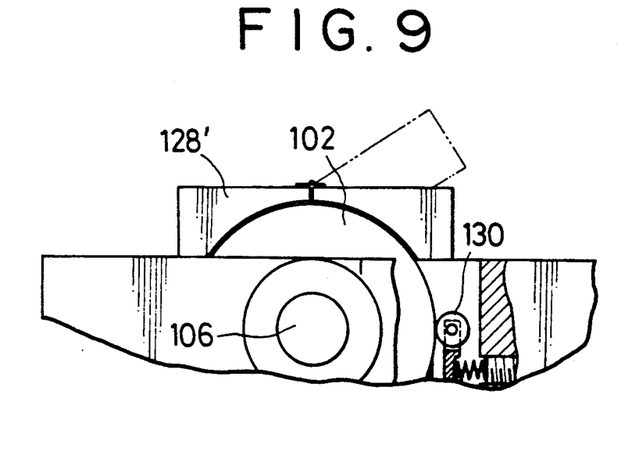
FIG. 9 is a front elevational view of a portion of the winding unit showing a modified pulley cover.

FIGS. 7 and 8 show a modified form of the winding unit according to the present invention. The modified winding unit is similar to the winding unit 12 of the embodiment shown in FIGS. 2, 3 and 5 but differs therefrom in that substantially all the component parts of the winding unit is disposed in a case 24, that a winding drum 64 is integral with a hollow shaft 76, and that a pulley cover 128 is associated with the guide pulley 102 for a purpose described below. Due to the structural similarity, these component parts which correspond to those shown in FIGS. 2, 3 and 5 are designated by identical reference characters and hence a description is no longer needed. The pulley cover 128 is mounted on a pulley support 104 adjacent to the guide pulley 102 for covering the peripheral surface of an upper portion of the guide pulley 108. The pulley cover 128 has an arcuate inside surface 128a substantially complementary in contour to the shape of the peripheral surface of guide pulley 102. The inside surface 128a may have a longitudinal groove (not shown) confronting to the guide groove 102a of the guide pulley 102. The pulley cover 128 preferably is formed of a rigid abrasion resistive plastic and has an integral structure. It is possible according to this invention to use a pulley cover 128' composed of a plurality of cover pieces hinged together, as shown in FIG. 9, for ease of maintenance. As shown in FIG. 7, the pull wire 20 is positively guided into the peripheral groove 102a of the guide pulley 102 by means of a guide roller 130 urged by a spring 132 against the outer peripheral surface of the guide pulley 102.

The pulley cover 128 serves to prevent detachment of the pull wire 20 off the guide pulley 102 which would otherwise occur due to the spring back or recoiling of the pull wire 20 when the single crystal grown by the CZ method is separated from the pull wire 20. With this pulley cover 128 thus provided, the pull wire 20 separated from the single crystal is prevented from getting entangled with another component part of the winding unit, thereby lowering the efficiency of the production of single crystals. The pulley cover 128 formed of a rigid abrasion resistive plastic does not produce any metallic particle even when subjected to friction contact with the pull wire and, therefore, the single crystal is protected from contamination with metal and hence is free from defects such as OSF.

Obviously, various modifications and variations of the present invention are possible in the light of the above teaching. It is therefore to be understood that within the scope of the appended claims the invention may be practiced otherwise than as specifically described.

What is claimed is:

1. An apparatus for producing a single crystal grown by the Czochralski method, comprising:

a main chamber having a quartz crucible disposed therein;

a winding unit, a bearing unit and a pull chamber with a gate valve unit therein disposed above said main chamber, said winding unit including a winding drum for winding and unwinding a flexible pulling means to pull a single crystal up from a melt of similar material retained in said quartz crucible while rotating the single crystal;

a horizontal turn plate rotatably disposed on said bearing unit;

a case disposed on said turn plate and receiving therein said winding drum, said case having a pair of diametrically opposite first and second openings;

a spline shaft supporting said winding drum rotatably disposed in said case and extending perpendicular to an axis of rotation of said turn plate, said spline having one end projecting outwardly from said first opening and connected in driven relation to a rotational power transmission mechanism disposed on said turn plate, the opposite end of said spline shaft projecting outwardly from said second opening and rotatably supported by a bearing plate upstanding from said turn plate, and means for sealing a furnace atmosphere surrounding said winding drum and said flexible pulling means wound thereon, said sealing means comprising first and second magnetic seal devices each including a tubular inner shaft fixedly mounted on an outer peripheral surface of one of first and second hollow shafts and a tubular housing rotatably mounted on said inner shaft with a magnetic fluid sealing retained therebetween, first bellows means having an end connected to said housing of said first magnetic seal device and an opposite end connected to a peripheral edge of said first opening, and second bellows means having an end connected to said housing of said second magnetic seal device and an opposite end connected to a peripheral edge of said second opening;

such that said furnace atmosphere surrounding said winding drum and said flexible pulling means is fully isolated from said rotational power transmission mechanism which rotates said winding drum.

2. An apparatus according to claim 1, wherein said first and second bellows means comprise welded bellows.

3. An apparatus according to claim 1, wherein each of said first and second magnetic seal devices further includes an annular permanent magnet disposed centrally between said housing and said inner shaft, and a pair of annular pole pieces located on opposite sides of said permanent magnet, said inner shaft having a pair of groups of parallel spaced peripheral grooves formed in its outer peripheral surface at portions corresponding in position to the position of the respective pole pieces, said magnetic fluid being sealingly received in said peripheral grooves.

4. An apparatus according to claim 1, further including a guide pulley disposed above said winding drum for guiding said flexible pulling means as the latter is winding on and unwinding from said winding drum.

5. An apparatus according to claim 4, further including a pulley cover disposed adjacent to said guide pulley for covering a peripheral surface of an upper portion of said guide pulley so as to prevent said flexible pulling means from getting off said guide pulley, said pulley cover having an arcuate inside surface complementary in contour to the shape of said peripheral surface of said guide pulley.

6. An apparatus according to claim 5, wherein said pulley cover has an integral structure.

7. An apparatus according to claim 5, wherein said pulley cover is composed of a plurality of cover pieces hinged together.

8. An apparatus according to claim 4, wherein said pulley cover is formed of a rigid abrasion resistive plastic.

9. An apparatus according to claim 4, wherein said guide pulley has a guide groove extending circumferentially in said peripheral surface of said guide pulley for receiving therein said flexible pulling means and carries at least one retainer pin disposed close to the periphery of said guide pulley and extending over and across said guide groove.

10. An apparatus according to claim 4, wherein said guide pulley has a guide groove extending circumferentially in said peripheral surface of said guide pulley for receiving therein said flexible pulling means, further including a spring-biased guide roller urged against said peripheral surface of said guide pulley.

11. An apparatus according to claim 1, further including a travel sensor associated with a portion of said rotational power transmission mechanism for detecting a distance of movement of said winding drum in a direction parallel to the longitudinal axis of said spline shaft.

12. An apparatus according to claim r, further including a travel sensor associated with a portion of said rotational power transmission mechanism for detecting a distance of movement of said winding drum in a direction parallel to the longitudinal axis of said spline shaft.

13. An apparatus according to claim 11, wherein said travel sensor comprises a circular slit disc connected to said portion of said rotational power transmission mechanism for co-rotation therewith and having a number of slits circumferentially spaced at equal intervals, and a photocoupler composed of a light emitting device and a light sensitive device disposed in confrontation with each other across said slit disc.

14. An apparatus according to claim 12, wherein said travel sensor comprises a circular slit disc connected to said portion of said rotational power transmission mechanism for co-rotation therewith and having a number of slits circumferentially spaced at equal intervals, and a photocoupler composed of a light emitting device and a light sensitive device disposed in confrontation with each other across said slit disc.

15. An apparatus according to claim 11, further including:
   a spline nut movably mounted on said spline shaft and carrying thereon said winding drum;
   said first hollow shaft loosely receiving therein a portion of said spline shaft and connected at one end to one end of said winding drum;
   said second hollow shaft loosely receiving therein a portion of said spline shaft and connected at one end to the opposite end of said winding drum, said second hollow shaft having an externally threaded portion on its outer peripheral surface; and
   a shaft guide plate connected to said second opening to substantially close the same and having an internally threaded hole engages with said externally threaded portion of said second hollow shaft whereby said spline shaft driven by said rotational power transmission mechanism in forward and reverse directions causes said winding drum to move in opposite directions along a longitudinal axis of said spline shaft while rotating about its own axis in opposite directions, thereby winding and unwinding said flexible pulling means.

* * * * *